(12) United States Patent
Hamaguchi et al.

(10) Patent No.: US 11,081,449 B2
(45) Date of Patent: Aug. 3, 2021

(54) SEMICONDUCTOR DEVICE AND METHOD FOR MANUFACTURING THE SAME AND WIRELESS COMMUNICATION APPARATUS

(71) Applicant: Mitsubishi Electric Corporation, Tokyo (JP)

(72) Inventors: Tsuneo Hamaguchi, Tokyo (JP); Tomohiro Tanishita, Tokyo (JP); Shota Sato, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/345,429

(22) PCT Filed: Nov. 2, 2017

(86) PCT No.: PCT/JP2017/039683
§ 371 (c)(1),
(2) Date: Apr. 26, 2019

(87) PCT Pub. No.: WO2018/088318
PCT Pub. Date: May 17, 2018

(65) Prior Publication Data
US 2019/0259711 A1    Aug. 22, 2019

(30) Foreign Application Priority Data
Nov. 11, 2016   (JP) .............................. JP2016-220482

(51) Int. Cl.
*H01L 23/552*   (2006.01)
*H01L 23/367*   (2006.01)
(Continued)

(52) U.S. Cl.
CPC ............ *H01L 23/552* (2013.01); *H01L 23/00* (2013.01); *H01L 23/36* (2013.01);
(Continued)

(58) Field of Classification Search
CPC ....... H01L 23/552; H01L 23/00; H01L 23/36; H01L 23/3675; H01L 23/40; H01L 23/4006
See application file for complete search history.

(56) References Cited

U.S. PATENT DOCUMENTS 9,024,434 B2 *   5/2015   Im ....................... H01L 23/4275
                                                           257/712
2001/0014012 A1   8/2001   Imazato
(Continued)

FOREIGN PATENT DOCUMENTS

EP   3 119 172 A1   1/2017
JP   H02196453 A    8/1990
(Continued)

OTHER PUBLICATIONS

"Method for Measuring Heat Conductivity in Thickness Direction and In -plane Direction by Steady-state Method", Journal of the Japan Institute of Electronics Packaging, vol. 18, No. 1 (2015), pp. 61-65, and English Translation of its Introduction. (7 pages).

(Continued)

*Primary Examiner* — Nathan W Ha
(74) *Attorney, Agent, or Firm* — Buchanan Ingersoll & Rooney PC

(57) ABSTRACT

An electromagnetic wave absorption sheet is arranged to contact an upper surface and side surfaces of an electronic component mounted on a wiring board, a heat conduction plate is arranged to contact the electromagnetic wave absorption sheet, a heat transfer sheet is arranged to contact the heat conduction plate, and a heat dissipation member is arranged to contact the heat transfer sheet. Heat conductive particles contained in the heat transfer sheet contact a flat surface portion of the heat conduction plate. The electromagnetic wave absorption sheet, the heat conduction plate, and the heat transfer sheet are interposed between the heat (Continued)

dissipation member and the electronic component, as a heat conduction member for conducting heat generated in the electronic component and the like to the heat dissipation member.

13 Claims, 10 Drawing Sheets

(51) Int. Cl.
*H01L 23/40* (2006.01)
*H01L 23/00* (2006.01)
*H05K 7/20* (2006.01)
*H01L 23/36* (2006.01)
*H05K 9/00* (2006.01)
*H01L 25/065* (2006.01)

(52) U.S. Cl.
CPC .......... *H01L 23/3675* (2013.01); *H01L 23/40* (2013.01); *H01L 23/4006* (2013.01); *H05K 7/20* (2013.01); *H05K 9/00* (2013.01); *H01L 24/16* (2013.01); *H01L 24/32* (2013.01); *H01L 24/73* (2013.01); *H01L 25/0655* (2013.01); *H01L 2023/4025* (2013.01); *H01L 2023/4087* (2013.01); *H01L 2224/16225* (2013.01); *H01L 2224/32225* (2013.01); *H01L 2224/73204* (2013.01); *H01L 2924/3025* (2013.01)

(56) References Cited

U.S. PATENT DOCUMENTS

| | | | | |
|---|---|---|---|---|
| 2002/0033561 | A1* | 3/2002 | Kawaguchi | H01L 23/3737 |
| | | | | 264/500 |
| 2002/0166686 | A1 | 11/2002 | Toyoda et al. | |
| 2003/0129352 | A1 | 7/2003 | Takahashi | |
| 2005/0027055 | A1 | 2/2005 | Dani et al. | |
| 2006/0037741 | A1 | 2/2006 | Tokuhira et al. | |
| 2006/0099403 | A1* | 5/2006 | Johnson | H01L 23/3737 |
| | | | | 428/323 |
| 2006/0188727 | A1 | 8/2006 | Ito et al. | |
| 2011/0024101 | A1 | 2/2011 | Han et al. | |
| 2012/0155029 | A1 | 6/2012 | Wong et al. | |
| 2014/0264820 | A1* | 9/2014 | Hu | H01L 23/3736 |
| | | | | 257/713 |
| 2014/0354314 | A1* | 12/2014 | Arora | G01R 31/2874 |
| | | | | 324/750.09 |
| 2016/0358884 | A1* | 12/2016 | Cavasin | H01L 23/3736 |
| 2017/0090532 | A1 | 3/2017 | Koukami et al. | |
| 2017/0330839 | A1* | 11/2017 | Kim | H01L 24/05 |
| 2018/0040568 | A1* | 2/2018 | Jian | H01L 25/16 |
| 2018/0082921 | A1* | 3/2018 | Grassmann | H01L 23/49537 |
| 2018/0162098 | A1* | 6/2018 | Joo | D03D 1/0058 |
| 2018/0277488 | A1* | 9/2018 | Takano | H01L 23/552 |
| 2018/0374776 | A1* | 12/2018 | Liu | H01L 23/48 |
| 2020/0203254 | A1* | 6/2020 | Dhane | H01L 23/3114 |
| 2020/0203288 | A1* | 6/2020 | Otsubo | H01L 23/552 |
| 2020/0211979 | A1* | 7/2020 | Hsieh | H01L 23/552 |
| 2020/0219823 | A1* | 7/2020 | Unezaki | H05K 9/0081 |
| 2020/0251455 | A1* | 8/2020 | Im | H01L 23/49838 |

FOREIGN PATENT DOCUMENTS

| | | |
|---|---|---|
| JP | 2000091362 A | 3/2000 |
| JP | 2000328006 A | 11/2000 |
| JP | 2001185893 A | 7/2001 |
| JP | 2002198686 A | 7/2002 |
| JP | 2003198166 A | 7/2003 |
| JP | 2003198173 A | 7/2003 |
| JP | 2006059998 A | 3/2006 |
| JP | 2006210892 A | 8/2006 |
| JP | 2008124258 A | 5/2008 |
| JP | 2009049333 A | 3/2009 |
| JP | 2011035400 A | 2/2011 |
| JP | 2012134501 A | 7/2012 |
| JP | 2016096249 A | 5/2016 |
| WO | 2014045671 A1 | 3/2014 |
| WO | 2015137257 A1 | 9/2015 |

OTHER PUBLICATIONS

International Search Report (PCT/ISA/210) and Written Opinion (PCT/ISA/237) dated Jan. 16, 2018, by the Japan Patent Office as the International Searching Authority for International Application No. PCT/JP2017/039683.

Office Action dated Apr. 22, 2020, issued in corresponding Japanese Patent Application No. 2018-550172,10 pages including 5 pages of English translation.

Office Action dated Jul. 3, 2020, by the German Patent Office in corresponding German Patent Application No. 112017005682.9 and English translation of the Office Action. (12 pages).

* cited by examiner

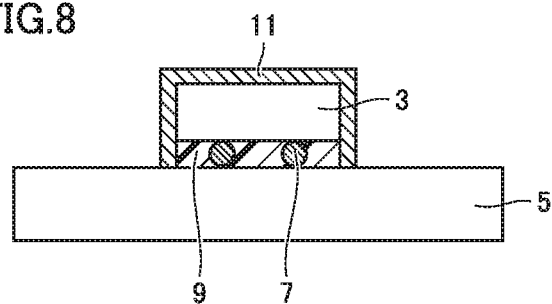
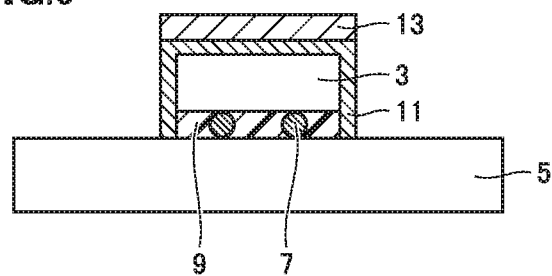
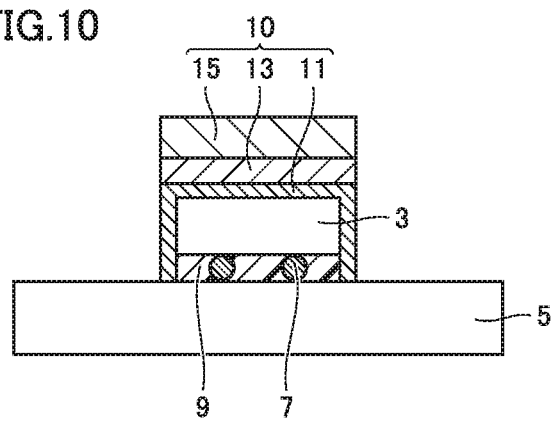

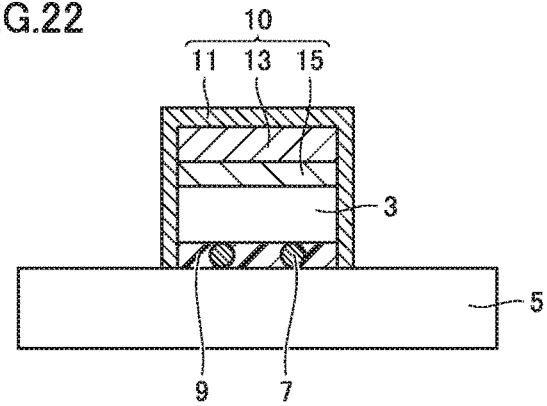
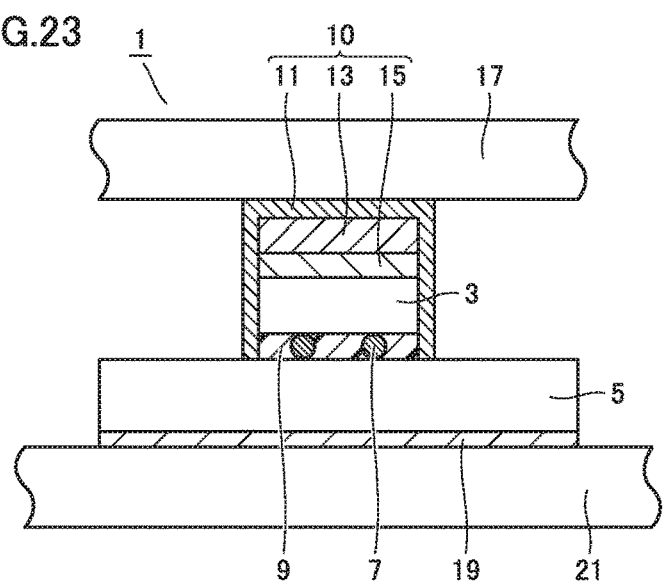
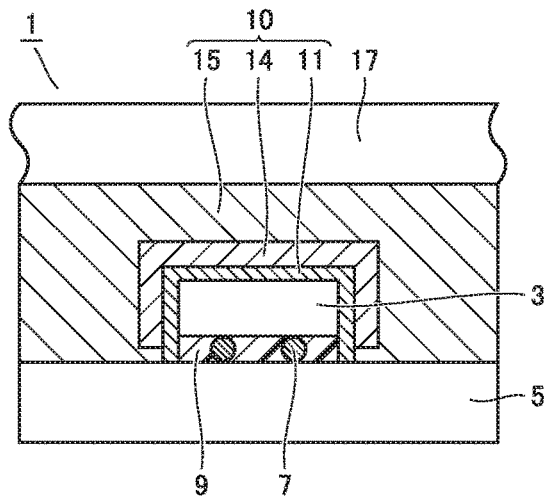

SEMICONDUCTOR DEVICE AND METHOD FOR MANUFACTURING THE SAME AND WIRELESS COMMUNICATION APPARATUS

TECHNICAL FIELD

The present invention relates to a semiconductor device and a method for manufacturing the same and a wireless communication apparatus. In particular, the present invention relates to a semiconductor device having an electromagnetic wave absorption sheet and a heat transfer sheet, a method for manufacturing such a semiconductor device, and a wireless communication apparatus to which such a semiconductor device is applied.

BACKGROUND ART

In recent years, as higher-speed communication and downsizing of electronic apparatuses, in particular, communication apparatuses progress, operation at higher frequencies has been promoted in electronic components such as semiconductor elements. As operation at higher frequencies is promoted in electronic components, an operation failure may be caused by an electromagnetic wave noise. Thus, a method for shielding electromagnetic waves by covering electronic components with a metal can is generally known.

However, in the technique of covering the electronic components with the metal can, the mounting area of the electronic components may be increased. In addition, electromagnetic waves generated from the respective electronic components may cause mutual interference within the metal can.

Thus, a technique of converting electromagnetic wave energy into heat energy is further proposed. In this technique, each electronic component is covered with an electromagnetic wave absorber having a function of absorbing electromagnetic waves. PTL 1 is an exemplary patent literature which discloses such a semiconductor device.

In addition, in order to downsize an electronic apparatus, it is necessary to mount electronic components with a high density. On the other hand, as operation at higher frequencies is promoted, the amount of generated heat increases in the electronic components. Accordingly, there is a need for a semiconductor device capable of efficiently performing absorption of electromagnetic waves and heat dissipation, and in particular, development of an electromagnetic wave absorption sheet excellent in heat dissipation properties is promoted. PTLs 2, 3, 4, and 5 are exemplary patent literatures which disclose such a semiconductor device.

CITATION LIST

Patent Literature

PTL 1: Japanese Patent Laying-Open No. 2000-328006
PTL 2: Japanese Patent Laying-Open No. 2002-198686
PTL 3: Japanese Patent Laying-Open No. 2003-198173
PTL 4: Japanese Patent Laying-Open No. 2008-124258
PTL 5: Japanese Patent Laying-Open No. 02-196453

SUMMARY OF INVENTION

Technical Problem

In a semiconductor device, it is required to shield electromagnetic waves generated from an electronic component, and to efficiently dissipate heat generated from the electronic component, including heat generated when shielding the electromagnetic waves.

The present invention has been made as part of such development. One object thereof is to provide a semiconductor device capable of absorbing electromagnetic waves generated from an electronic component and efficiently dissipating heat generated from the electronic component and the like. Another object thereof is to provide a method for manufacturing such a semiconductor device. Still another object thereof is to provide a wireless communication apparatus including such a semiconductor device.

Solution to Problem

A semiconductor device in accordance with the present invention includes a wiring board, an electronic component, a heat dissipation member, and a heat conduction member. The electronic component is mounted on the wiring board. The heat dissipation member is arranged to be spaced from the electronic component. The heat conduction member is interposed between the heat dissipation member and the electronic component, and conducts heat generated in the electronic component to the heat dissipation member. The heat conduction member includes an electromagnetic wave absorption sheet, a heat transfer sheet, and a heat conduction plate having a flat surface portion. In the heat transfer sheet, heat conductive particles are added to a resin. The heat conduction plate having the flat surface portion is interposed between the electromagnetic wave absorption sheet and the heat transfer sheet. The heat conductive particles contact the flat surface portion of the heat conduction plate.

A wireless communication apparatus in accordance with the present invention includes the semiconductor device described above.

A method for manufacturing a semiconductor device in accordance with the present invention includes mounting an electronic component on a wiring board, arranging a heat conduction member to contact the electronic component, and arranging a heat dissipation member to contact the heat conduction member. Arranging the heat conduction member includes arranging an electromagnetic wave absorption sheet, arranging a heat transfer sheet in which heat conductive particles are added to a resin, and arranging a heat conduction plate having a flat surface portion. In arranging the heat conduction plate, the heat conduction plate is arranged between the electromagnetic wave absorption sheet and the heat transfer sheet to contact the electromagnetic wave absorption sheet and the heat transfer sheet. In arranging the heat dissipation member, the heat conduction member is pressed by the heat dissipation member toward the electronic component.

Advantageous Effects of Invention

According to the semiconductor device in accordance with the present invention, electromagnetic waves generated from the electronic component can be absorbed by the electromagnetic wave absorption sheet, and heat generated from the electronic component and heat generated from the electromagnetic wave absorption sheet by absorbing the electromagnetic waves can be efficiently dissipated through the heat conduction member including the heat conduction plate and the heat transfer sheet.

According to the wireless communication apparatus in accordance with the present invention, heat and the like generated from the electronic component can be efficiently dissipated.

According to the method for manufacturing the semiconductor device in accordance with the present invention, it is possible to manufacture the semiconductor device capable of allowing the electromagnetic wave absorption sheet to absorb electromagnetic waves generated from the electronic component, and efficiently dissipating heat generated from the electronic component and the like through the heat conduction member including the heat conduction plate and the heat transfer sheet.

BRIEF DESCRIPTION OF DRAWINGS

FIG. 8 is a cross sectional view showing a step performed after the step shown in FIG. 7 in the same embodiment.

FIG. 9 is a cross sectional view showing a step performed after the step shown in FIG. 8 in the same embodiment.

FIG. 10 is a cross sectional view showing a step performed after the step shown in FIG. 9 in the same embodiment.

FIG. 22 is a cross sectional view showing a step performed after the step shown in FIG. 21 in the same embodiment.

FIG. 23 is a cross sectional view showing a step performed after the step shown in FIG. 22 in the same embodiment.

FIG. 24 is a cross sectional view of a semiconductor device in accordance with a sixth embodiment.

DESCRIPTION OF EMBODIMENTS

First Embodiment

Figure 1:
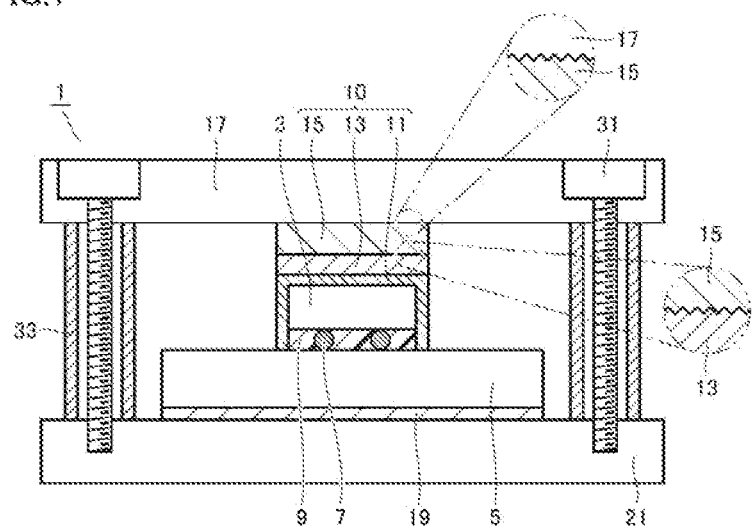
FIG. 1 is a cross sectional view of a semiconductor device in accordance with a first embodiment.

A semiconductor device in accordance with a first embodiment will be described. As shown in FIG. 1, in a semiconductor device 1, a wiring board 5 is joined to a surface of a supporting member 21 by a bonding layer 19. As bonding layer 19, an electroconductive adhesive, solder, or the like is applied, for example.

An electronic component 3 is mounted on a surface of wiring board 5. Electronic component 3 is electrically connected to a wire (not shown) formed in wiring board 5 by a solder joint portion 7. A thermosetting resin 9 such as an epoxy resin, for example, is filled into a region between electronic component 3 and wiring board 5 around solder joint portion 7. Thermosetting resin 9 has a function of improving joint reliability of solder joint portion 7.

An electromagnetic wave absorption sheet 11 is arranged to contact an upper surface and side surfaces of electronic component 3. A heat conduction plate 13 is arranged to contact a portion of electromagnetic wave absorption sheet 11 covering the upper surface of electronic component 3. A heat transfer sheet 15 is arranged to contact heat conduction plate 13. A heat dissipation member 17 is arranged to contact heat transfer sheet 15.

Electromagnetic wave absorption sheet 11, heat conduction plate 13, and heat transfer sheet 15 are arranged to be interposed between electronic component 3 and heat dissipation member 17, as a heat conduction member 10 for conducting, to heat dissipation member 17, heat generated in electronic component 3 and heat generated when electromagnetic wave absorption sheet 11 absorbs electromagnetic waves.

Heat dissipation member 17 is fixed to supporting member 21 by screws 31. By tightening screws 31, heat transfer sheet 15 and electromagnetic wave absorption sheet 11 are pressed via heat dissipation member 17 toward electronic component 3. On this occasion, it is desirable to apply pressure in the range of about $5 \times 10^4$ Pa to $50 \times 10^4$ Pa, for example. However, the pressure is not limited to this range.

During pressing, thermosetting resin 9 filled between electronic component 3 and wiring board 5 has a function of reducing a load on solder joint portion 7 and suppressing occurrence of a crack in solder joint portion 7. In addition, spacers 33 are arranged between heat dissipation member 17 and supporting member 21 to prevent excessive pressing.

A heat dissipation path for the heat generated in electronic component 3 includes a heat dissipation path for conducting the heat to heat dissipation member 17 through heat conduction member 10 (a first heat dissipation path) as described above, and a heat dissipation path for conducting the heat from electronic component 3 to supporting member 21 through solder joint portion 7, wiring board 5, and bonding layer 19 (a second heat dissipation path).

However, in the second heat dissipation path, solder joint portion 7 has a small cross sectional area, and thermosetting resin 9 has a poor heat conductivity. Thus, the heat generated in electronic component 3 is mainly dissipated through the first heat dissipation path.

From a viewpoint of heat dissipation, the size of heat conduction plate 13 is desirably the same as or larger than the size of electronic component 3 when electronic component 3 mounted on wiring board 5 is viewed in plan view from above.

In addition, as heat dissipation member 17 and supporting member 21, they are not particularly limited as long as they can dissipate the heat generated in electronic component 3 and conducted mainly through the first heat dissipation path. They are desirably a heat sink, a casing, or the like made of a metal such as aluminum, magnesium, or the like, for example.

Electromagnetic wave absorption sheet 11, heat conduction plate 13, heat transfer sheet 15, and heat dissipation member 17 located in the first heat dissipation path are neither joined to one another nor bonded to one another. Thus, even when electromagnetic wave absorption sheet 11, heat conduction plate 13, heat transfer sheet 15, and heat dissipation member 17 have different thermal expansions (coefficients), no peeling occurs at each interface.

Thereby, the state where electromagnetic wave absorption sheet 11, heat conduction plate 13, heat transfer sheet 15, and heat dissipation member 17 are in contact with one another is maintained, without imparting the effect of absorbing electromagnetic waves, and without interrupting the heat dissipation path at some point therein.

In addition, electromagnetic wave absorption sheet 11 located in the first heat dissipation path is arranged to contact the upper surface and the side surfaces of the electronic component. This can prevent electromagnetic waves from being emitted from electronic component 3 to the outside, and suppress electromagnetic waves from entering electronic component 3 from the outside and affecting electronic component 3.

Energy of the electromagnetic waves absorbed by electromagnetic wave absorption sheet 11 is converted into heat energy, is conducted to heat dissipation member 17 mainly through the first heat dissipation path together with the heat generated from electronic component 3, and then is dissipated.

Next, each member constituting heat conduction member 10 located in the first heat dissipation path will be described in more detail.

First, electromagnetic wave absorption sheet 11 will be described. As electromagnetic wave absorption sheet 11, a sheet in which particles of a magnetic substance are mixed into a resin is applied. As the resin, for example, an acrylic resin, a polyurethane resin, a polyethylene resin, or the like is desirable. As the magnetic substance, for example, ferrite, Sendust, or the like is desirable.

When ferrite is applied as the magnetic substance, the heat conductivity of ferrite is higher than the heat conductivity of the resin, and is about 1 to 5 W/(m·K). The heat conductivity of electromagnetic wave absorption sheet 11 in which particles of ferrite are filled into the resin is about 0.8 W/(m·K). On the other hand, the heat conductivity of heat transfer sheet 15 in which particles of aluminum oxide, which is more heat conductive than ferrite, are filled into a resin is higher than the heat conductivity of electromagnetic wave absorption sheet 11 by five or more times. Heat conduction of electromagnetic wave absorption sheet 11 is worse than heat conduction of heat transfer sheet 15.

Here, heat dissipation performance by heat conduction will be described. The heat dissipation performance is evaluated using a thermal resistance. The thermal resistance is an index indicating the difficulty of heat conduction, and means a temperature increase per unit amount of generated heat. A thermal resistance $Ri$ in a member $i$ in a heat conduction path is expressed by an equation (1) and an equation (2) below, where $ti$ is the thickness of member $i$, $\lambda i$ is the heat conductivity of member $i$, and $Ai$ is the heat transfer area of member $i$.

$$Ri = Rbi + Rci \qquad \text{Equation (1)}$$

$$Rbi = ti/(\lambda i Ai) \qquad \text{Equation (2)}$$

In equation (1) and equation (2), $Rbi$ is a thermal resistance within member $i$, and is referred to as a bulk thermal resistance. $Rci$ indicates a thermal resistance at an interface of member $i$, and is referred to as a contact thermal resistance. In order to increase the amount of heat passing through member $i$, it is necessary to decrease thermal resistance $Ri$.

Therefore, in order to improve the heat conduction of electromagnetic wave absorption sheet 11 which is worse than the heat conduction of heat transfer sheet 15, it is necessary to decrease thermal resistance $Ri$ in electromagnetic wave absorption sheet 11. It can be seen from equation (1) and equation (2) that, in order to decrease thermal resistance $Ri$ in electromagnetic wave absorption sheet 11, it is desirable to reduce thickness $ti$ of electromagnetic wave absorption sheet 11 and decrease bulk thermal resistance $Rbi$. Thus, in this semiconductor device 1, the thickness of electromagnetic wave absorption sheet 11 is set to about 0.5 mm, for example. It should be noted that this thickness of electromagnetic wave absorption sheet 11 is an example, and the thickness of electromagnetic wave absorption sheet 11 is not limited thereto.

In addition, in order to improve the heat conduction of electromagnetic wave absorption sheet 11, alumina particles having a high heat conduction may be mixed, in addition to the particles of the magnetic substance. In electromagnetic wave absorption sheet 11 having alumina particles mixed therein, its heat conductivity can be increased to about 2 W/(m·K), for example. When the inventors measured an Asker C hardness of electromagnetic wave absorption sheet 11 having alumina particles mixed therein, a value of 60 to 90 was obtained, and it was confirmed that electromagnetic wave absorption sheet 11 has an increased hardness. It should be noted that the Asker C hardness refers to a hardness measured using ASKER Rubber Hardness Tester Type C manufactured by KOBUNSHI KEIKI CO., LTD., for example.

Next, heat transfer sheet 15 will be described. Heat transfer sheet 15 is formed by mixing ceramic particles or metal particles into a resin of a thermosetting silicone gel, applying the mixture in the shape of a sheet, and then heating the sheet (at about 70 to 150° C.) to cure the resin of the silicone gel. As the ceramic particles, for example, particles of aluminum oxide, aluminum hydroxide, aluminum nitride, or the like are desirable. As the metal particles, for example, particles of a metal having a relatively high heat conductivity, such as copper or aluminum, are desirable.

In heat transfer sheet 15, heat is conducted via heat conductive particles. Thus, it is desirable to shorten the distance between the heat conductive particles, or to bring the heat conductive particles into contact with one another, by pressing heat conduction member 10 including heat transfer sheet 15 by heat dissipation member 17. For that purpose, a resin which is relatively soft after being cured is desirable as the resin of the silicone gel. This semiconductor device 1 uses heat transfer sheet 15 to which a resin having a penetration of 30 or more is applied, the penetration being measured according to a measuring method defined by Japanese Industrial Standards (JIS K2220).

As the heat conductive particles to be mixed into the resin of the silicone gel, it is desirable to mix heat conductive particles having several types of different sizes (for example, having a major axis of about 10 to 80 µm), in order to densely fill the heat conductive particles into the resin. When the inventors measured an Asker C hardness of fabricated heat transfer sheet 15, a value of 30 or less was obtained, and it was confirmed that heat transfer sheet 15 is relatively soft.

Further, the inventors analyzed a surface of heat transfer sheet 15. As a result, it has been found that the heat conductive particles responsible for heat conduction are not exposed to the surface of heat transfer sheet 15 and the surface is covered with the resin (silicone gel), and the thickness of the resin is about 10 µm.

Furthermore, the inventors evaluated a behavior of the heat conductive particles within the resin when the heat transfer sheet was pressed. Specifically, the inventors experimentally verified that, when the heat transfer sheet arranged on the heat conduction plate is pressed, the silicone gel in a surface of the resin flows, allowing the heat conductive particles to come into direct contact with the heat conduction plate.

Figure 2:
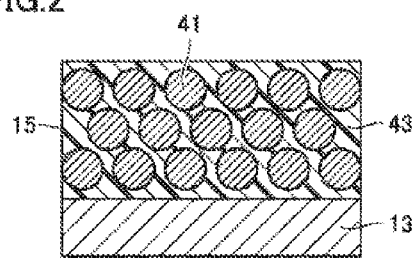
FIG. 2 is a partial cross sectional view showing a manner of contact of a heat transfer sheet with a heat conduction plate before the heat transfer sheet is pressurized in the same embodiment.
Figure 3:
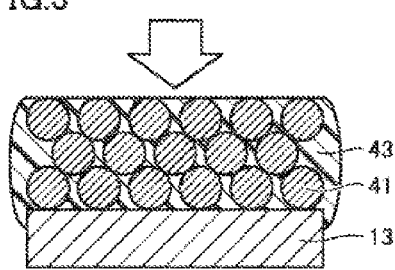
FIG. 3 is a partial cross sectional view showing a manner of contact of the heat transfer sheet with the heat conduction plate after the heat transfer sheet is pressurized in the same embodiment.

First, FIG. 2 shows a state of heat transfer sheet 15 arranged on heat conduction plate 13 before a load is applied to heat transfer sheet 15, as a schematic cross sectional view. FIG. 3 shows a state of the heat transfer sheet after the load is applied to heat transfer sheet 15, as a schematic cross sectional view.

As shown in FIG. 2, before the load is applied to heat transfer sheet 15, heat conductive particles 41 are located within silicone gel 43. As shown in FIG. 3, when the load is applied to heat transfer sheet 15 (see the arrow), at an interface between heat conduction plate 13 and heat transfer sheet 15, silicone gel 43 flows and heat conductive particles 41 contact a flat surface portion of heat conduction plate 13. In addition, heat conductive particles 41 also contact one another.

Thereby, both a contact thermal resistance (Rc) at the interface between heat transfer sheet 15 and heat conduction plate 13 and a bulk thermal resistance (Rb) within heat transfer sheet 15 can be decreased simultaneously. As a result, a good heat conduction is obtained, and heat dissipation performance can be improved.

Figure 4:
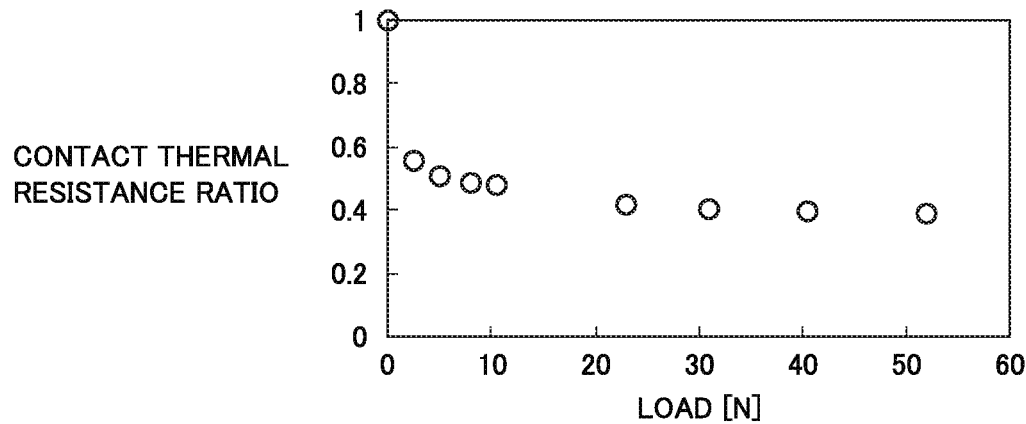
FIG. 4 is a graph showing the relation between contact thermal resistance ratio and load in the same embodiment.

Next, FIG. 4 shows a graph evaluating the relation between an applied load and the thermal resistance of the heat transfer sheet when a copper heat conduction plate was used as a heat conduction plate, and the load was applied to a heat transfer sheet arranged on the heat conduction plate to press the heat transfer sheet against the heat conduction plate.

The heat transfer sheet had a size of 15 mm×15 mm, and a thickness of 1 mm. The thermal resistance was measured with a measuring device using an unidirectional heat flow steady-state comparison method in conformity with Japanese Industrial Standards (JIS H7903).

In the measuring device, a heating block is provided at an upper portion and a cooling block is provided at a lower portion, and rods sandwiching the heat transfer sheet is arranged between the heating block and the cooling block. The rods are provided with copper pieces having a high heat conductivity for sandwiching the heat transfer sheet, and thermocouples. The inventors measured the thermal resistance of the heat transfer sheet, from a temperature difference between the rods on a high temperature side and the rods on a low temperature side, and a heat flux passing through the heat transfer sheet.

In the graph, the axis of abscissas represents the load, and the axis of ordinates represents the thermal resistance. The thermal resistance is indicated as a relative value (contact thermal resistance ratio) with respect to a thermal resistance when the heat transfer sheet and the rods are brought into contact under a load of 20 N per 15 mm×15 mm (=9×10$^4$ Pa), which is defined as 1. As shown in the graph, it is recognized that the thermal resistance when the load is relatively low tends to be considerably decreased to about 50% of the thermal resistance in the contact state.

This tendency is considered to be because the silicone gel located at the interface with the heat conduction plate flows and the heat conductive particles contact the heat conduction plate, and thereby the thermal resistance is decreased. Based on this result, it proves important that, in order to allow silicone gel 43 to flow, heat transfer sheet 15 is in contact with a surface of heat conduction plate 13 and not fixed at the contact interface. In addition, in order to allow silicone gel 43 to flow efficiently, it is considered desirable to apply, as heat conduction plate 13, a heat conduction plate which is rigid and has a flat surface portion with no asperities on a surface.

Figure 5:
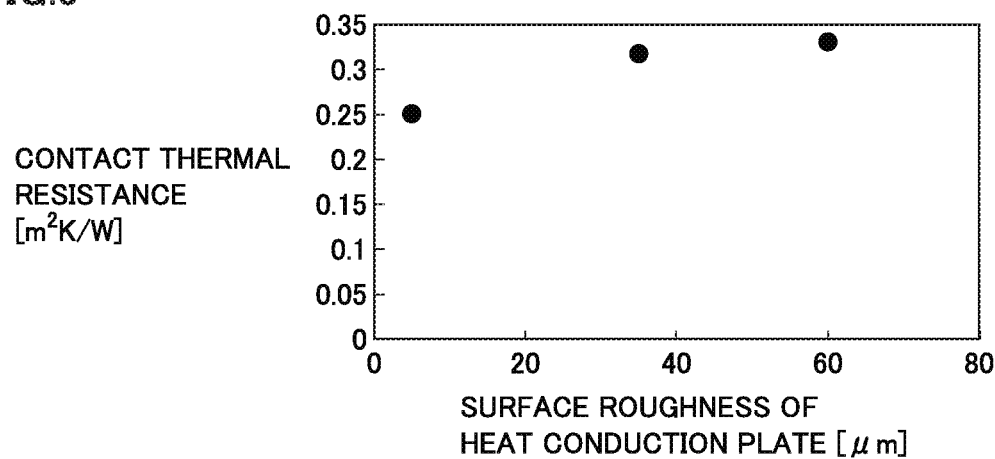
FIG. 5 is a graph showing the relation between contact thermal resistance and the surface roughness of the heat conduction plate in the same embodiment.

Next, a description will be given on a result of evaluation performed on the influence of the surface roughness of the flat surface portion of heat conduction plate 13 on the contact thermal resistance (Rc) at the interface between heat conduction plate 13 and heat transfer sheet 15. FIG. 5 shows a graph showing the result of the evaluation. In the graph, the axis of abscissas represents the surface roughness of the flat surface portion of the heat conduction plate, and the axis of ordinates represents the contact thermal resistance. The contact thermal resistance was measured using the same measuring device as that used for the evaluation in FIG. 4. Further, as a measuring method, a measuring method disclosed in a document ("Method for Measuring Heat Conductivity in Thickness Direction and In-plane Direction by Steady-state Method", Journal of the Japan Institute of Electronics Packaging, Vol. 18, No. 1 (2015)) was used.

Figure 6:
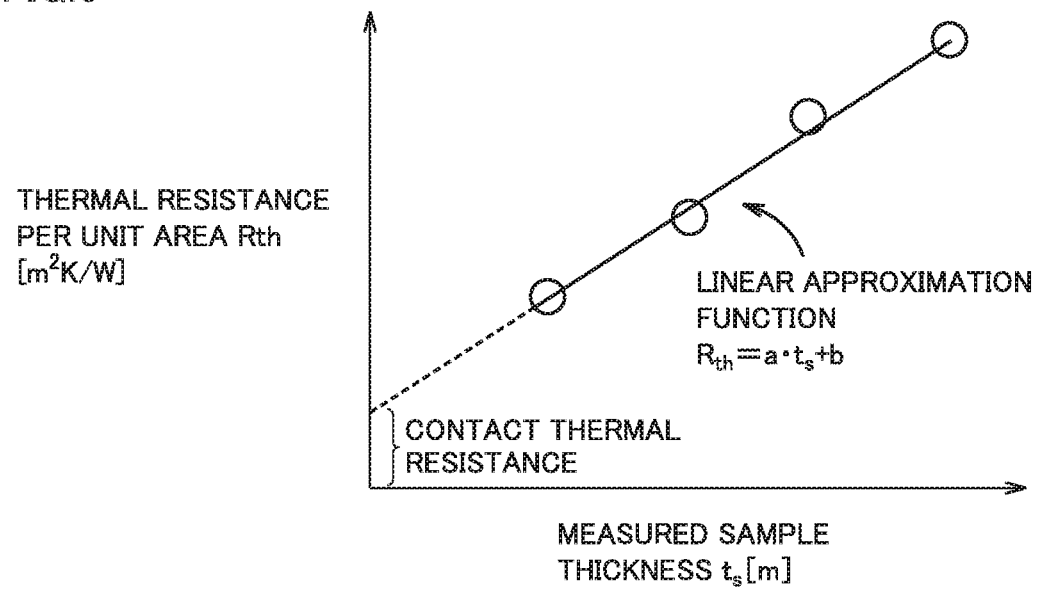
FIG. 6 is a graph showing the relation between thermal resistance per unit area and measured sample thickness in the same embodiment.

First, as shown in FIG. 6, a plurality of heat transfer sheets having different thicknesses were prepared, the relation between the thickness of the heat transfer sheet and the thermal resistance was obtained through an experiment, and, based on a result thereof, the relation between the thickness of the heat transfer sheet and the thermal resistance was approximated by a linear function ($R_{th}=a \times t_s+b$). Then, the value of the thermal resistance when the thickness of heat transfer sheet 15 was 0 was obtained by extrapolation, as the contact heat resistance (Rc). That is, the value of b in the linear function was obtained as a value of the contact thermal resistance. The inventors used the heat transfer sheets having thicknesses of 1 mm, 2 mm, and 3 mm to measure thermal resistances thereof, and calculated the value of the contact thermal resistance based on measurement results.

In order to examine the dependence of the contact thermal resistance on the surface roughness, a heat transfer sheet having 70 volume % of aluminum oxide filled therein and having a value of Asker C hardness of 20 was used as heat transfer sheet 15. A plurality of copper plates with flat surface portions having different surface roughnesses were used as heat conduction plates 13. As a value of the surface roughness, an interval (Ry) between a peak line and a valley line measured according to a method defined by Japanese Industrial Standards (JIS B0031) was used.

As shown in FIG. 5, it has been found that the contact thermal resistance (Rc) is influenced by the surface roughness of the flat surface portion of heat conduction plate 13, and the contact thermal resistance (Rc) is decreased with a decrease in surface roughness (Ry). It can be seen that the value of the contact thermal resistance when the surface roughness is 5 μm is lower than the value of the contact thermal resistance when the surface roughness is 60 μm, by about 25%.

This seems to indicate that, as the surface roughness is decreased, silicone gel 43 flows more easily, and the contact area between heat conductive particles 41 and the flat surface portion of heat conduction plate 13 is increased. It was also able to be confirmed from an observation result of the experiment that flowability of the silicone gel deteriorates when the flat surface portion has a large surface roughness.

Based on the above result of the evaluation, it has been found that, in order to obtain a good heat conduction, it is desirable to arrange heat conduction plate 13 having a flat surface portion between heat transfer sheet 15 and electromagnetic wave absorption sheet 11, and set the surface roughness (Ry) of the flat surface portion to less than or equal to 5 μm. In addition, in that flat surface portion, the flatness defined by Japanese Industrial Standards (JIS B0621) is within ±10 μm.

In semiconductor device 1 in accordance with the first embodiment, a 0.2 mm-thick copper plate having rigidity and a good heat conduction is used as heat conduction plate 13. When copper is used for heat conduction plate 13, it is only necessary for heat conduction plate 13 to have a thickness of more than or equal to 0.2 mm, in order not to be influenced by heat conductive particles 41 in heat transfer sheet 15.

Further, heat transfer sheet 15 also contacts heat dissipation member 17, in addition to heat conduction plate 13. Accordingly, in order to obtain a good heat conduction, it is also desirable that a surface of heat dissipation member 17 is a flat surface and the surface roughness (Ry) thereof is set to less than or equal to 5 μm, as with the flat surface portion of heat conduction plate 13.

In semiconductor device 1 in accordance with the first embodiment, acrylic rubber is used as the resin of electromagnetic wave absorption sheet 11 to improve dispersibility of the particles of the magnetic substance. However, a silicone gel may be used. When the heat conductive particles are filled into the silicone gel, heat conductive particles 41 can be brought into direct contact with a flat surface portion of heat conduction plate 13 at an interface between electromagnetic wave absorption sheet 11 and the flat surface portion of heat conduction plate 13, and thus heat dissipation performance can be significantly improved.

In addition, when the silicone gel is used as the resin of electromagnetic wave absorption sheet 11, it is desirable to set the surface roughness of a surface portion of electronic component 3 contacted by electromagnetic wave absorption sheet 11 to less than or equal to 5 μm, in order to obtain a good heat conduction.

Figure 7:
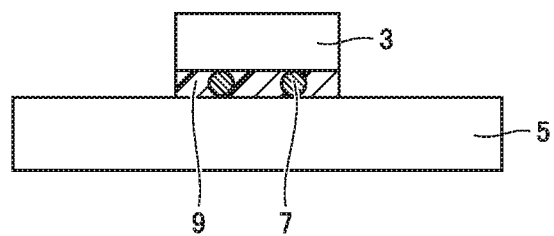
FIG. 7 is a cross sectional view showing one step of a method for manufacturing the semiconductor device shown in FIG. 1 in the same embodiment.

Next, an example of a method for manufacturing the semiconductor device shown in FIG. 1 will be described. First, as shown in FIG. 7, electronic component 3 is joined onto the surface of wiring board 5 by a method using an ordinary solder paste (solder joint portion 7). Then, solder joint portion 7 is covered with thermosetting resin 9 which is consistent with thermal expansion of the solder. Then, as shown in FIG. 8, electromagnetic wave absorption sheet 11, to which an acrylic resin sheet with a thickness of about 0.2 mm having ferrite filled therein is applied, is arranged to contact the upper surface and the side surfaces of electronic component 3.

Then, as shown in FIG. 9, heat conduction plate 13 using a copper flat plate with a thickness of 0.2 mm and a surface roughness (Ry) of less than or equal to 5 μm is arranged to contact an upper surface of electromagnetic wave absorption sheet 11. Then, as shown in FIG. 10, 1 mm-thick heat transfer sheet 15 having about 70 volume % of particles of aluminum oxide, which are heat conductive particles, filled therein is arranged to contact heat conduction plate 13. Thereafter, wiring board 5 having electronic component 3 mounted thereon is fixed to supporting member 21 by conductive bonding layer 19, for example (see FIG. 11).

Figure 11:
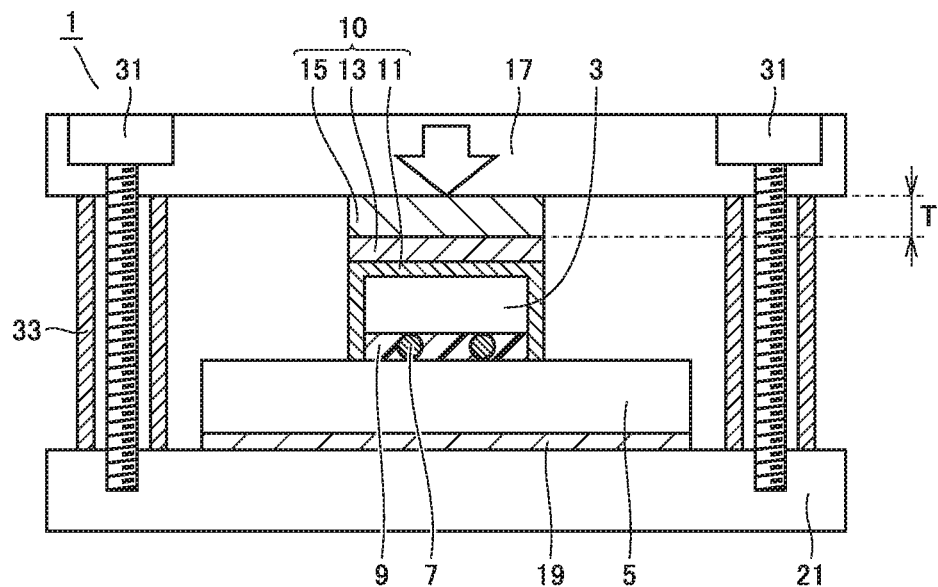
FIG. 11 is a cross sectional view showing a step performed after the step shown in FIG. 10 in the same embodiment.

Then, as shown in FIG. 11, heat dissipation member 17 made of aluminum is arranged to contact heat transfer sheet 15. Then, by tightening screws 31, heat transfer sheet 15 is pressed by heat dissipation member 17 (see the arrow), with electronic component 3 and the like being sandwiched between heat dissipation member 17 and supporting member 21. Heat transfer sheet 15 is pressed by heat dissipation member 17 until its thickness T is reduced from 1.0 mm to about 0.7 mm. In this way, the main portion of semiconductor device 1 is completed.

In semiconductor device 1 described above, the influence of electromagnetic waves on electronic component 3 can be suppressed, and the heat generated from electronic component 3 and the heat generated from electromagnetic wave absorption sheet 11 can be efficiently dissipated through heat conduction member 10 including heat conduction plate 13 and heat transfer sheet 15.

In contrast, as a comparative example to be compared with semiconductor device 1 in accordance with the first embodiment, for example, a semiconductor device implemented by arranging an electromagnetic wave absorption paste described in PTL 1 in the semiconductor device described in PTL 5 is assumed. In such a semiconductor device, the heat conductivity (λ) of ferrite particles contained in the electromagnetic wave absorption paste is 1 to 5 W/(m·K), which is ⅙ or less of the heat conductivity of alumina commonly used for a heat transfer member. Thus, it is conceivable that the bulk thermal resistance (Rb) in equation (1) described above is increased and heat dissipation properties deteriorate.

Further, as a comparative example, the semiconductor device described in PTL 2 is assumed. In a sheet applied to this semiconductor device, electromagnetic wave absorption/heat dissipation layers are bonded to both surfaces of a metallic foil. However, since these electromagnetic wave absorption/heat dissipation layers contain heat conduction particles and a magnetic substance powder having a poor heat conduction, it is conceivable that heat conduction deteriorates when compared with a case where they contain heat conduction particles only.

In addition, the heat conductivity of an adhesive used for bonding is 1/100 of that of the heat conduction particles. Thus, it is conceivable that heat conduction further deteriorates due to the poor heat conductivity. Accordingly, the bulk thermal resistance (Rb) in equation (1) described above is increased, and the contact thermal resistance (Rc) is also increased due to an increased number of contact interfaces. Thus, it is considered difficult to improve heat dissipation performance.

Furthermore, as a comparative example, the semiconductor device described in PTL 3 is assumed. In an electromagnetic wave absorption/heat dissipation sheet applied to this semiconductor device, a metal deposition film (film thickness: 0.01 to 0.1 μm) is stacked on a surface of a heat conduction sheet in which heat conduction particles are mixed into a silicone resin, so as not to be peeled off. It is conceivable that, when this electromagnetic wave absorption/heat dissipation sheet is pressurized by a heat dissipation member, the silicone resin is less likely to flow at an interface of the metal deposition film, because the metal deposition film is stacked so as not to be peeled off. In addition, since the metal deposition film has no rigidity, the metal deposition film is less likely to directly contact heat conductive particles contained in the heat conduction sheet. As a result, it is conceivable that the contact thermal resistance (Rc) at the bonding interface is increased and heat dissipation performance deteriorates.

Furthermore, as a comparative example, the semiconductor device described in PTL 4 is assumed. A sheet applied to this semiconductor device is composed of a stacked body including a heat conduction layer, an electrical conduction layer, and an insulating layer. Accordingly, the number of contact interfaces is increased, and thus the total value (ΣRci) of contact thermal resistances between the stacked members is increased. In addition, the insulating layer is formed of a resin sheet having a poor heat conduction (1/100 of that of heat conduction particles) such as polyimide. As a result, it is conceivable that heat dissipation performance deteriorates.

(Variation)

In semiconductor device 1 described above, an electronic component in which an electrode for establishing electrical connection with the outside (not shown) is arranged on a lower surface of electronic component 3 has been described as exemplary electronic component 3. The electronic component is not limited to the electronic component of this type, and for example, an electronic component in which a lead electrode protrudes from a side surface of the electronic component (body) is also applicable.

Figure 12:
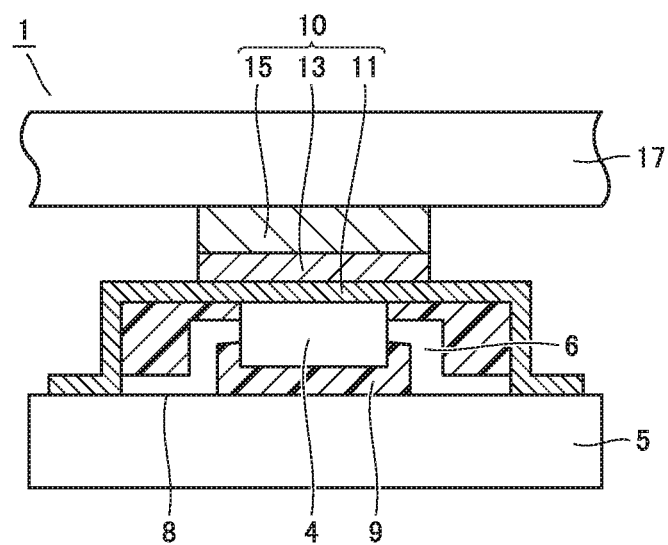
FIG. 12 is a cross sectional view of a semiconductor device in accordance with a variation in the same embodiment.

FIG. 12 shows semiconductor device 1 to which an electronic component 4 of this type is applied. As shown in FIG. 12, a lead electrode 6 protruding from a side surface of electronic component 4 is joined to wiring board 5 by a solder joint portion 8. Thermosetting resin 9 is filled between solder joint portion 8 of lead electrode 6 and electronic component 4 (lower surface). Electromagnetic wave absorption sheet 11 is arranged to cover electronic component 4 and lead electrodes 6. Heat conduction plate 13 is arranged to contact electromagnetic wave absorption sheet 11, and heat transfer sheet 15 is arranged to contact heat conduction plate 13. Heat transfer sheet 15 and the like are pressed by heat dissipation member 17.

Also in semiconductor device 1 to which electronic component 4 of this type is applied, the influence of electromagnetic waves on electronic component 4 can be suppressed, and heat generated from electronic component 4 and heat generated from electromagnetic wave absorption sheet 11 can be efficiently dissipated through heat conduction member 10 including heat conduction plate 13 and heat transfer sheet 15.

Second Embodiment

As a semiconductor device in accordance with a second embodiment, an example of a semiconductor device having a plurality of electronic components mounted on a wiring board will be described.

Figure 13:
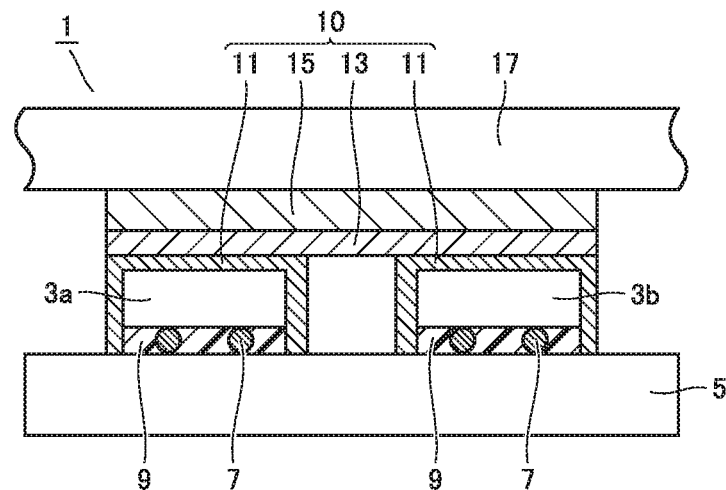
FIG. 13 is a cross sectional view of a semiconductor device in accordance with a second embodiment.

As shown in FIG. 13, in semiconductor device 1, a plurality of electronic components 3 are mounted on wiring board 5. Here, two electronic component 3a and 3b are mounted as an example thereof. Electromagnetic wave absorption sheet 11 is arranged to contact an upper surface and side surfaces of each of two electronic components 3a and 3b. Heat conduction plate 13 is arranged to contact upper surfaces of electromagnetic wave absorption sheets 11 in a manner extending over electronic components 3a and 3b. Heat transfer sheet 15 is arranged to contact heat conduction plate 13.

Heat dissipation member 17 is arranged to contact heat transfer sheet 15. Further, also in this semiconductor device 1, wiring board 5 is joined to a supporting member (not shown), as in the semiconductor device shown in FIG. 1. Further, heat transfer sheet 15 and electromagnetic wave absorption sheet 11 are pressed via heat dissipation member 17 toward electronic components 3a and 3b. It should be noted that members identical to those of semiconductor device 1 shown in FIG. 1 will be designated by the same reference numerals, and the description thereof will not be repeated, except when necessary.

In semiconductor device 1 described above, electromagnetic wave absorption sheet 11 is arranged to cover each of two electronic components 3a and 3b. This can prevent occurrence of interference of electromagnetic waves between electronic components 3a and 3b.

Heat generated in electronic components 3a and 3b is conducted to electromagnetic wave absorption sheets 11, and then conducted to heat conduction plate 13. Heat conduction plate 13 is formed of a metal having a good heat conduction, such as copper or aluminum. Thus, the heat is spread over a surface of heat conduction plate 13. The heat conducted into the surface of heat conduction plate 13 is conducted through heat transfer sheet 15.

In particular, since heat conduction plate 13 is arranged to extend over two electronic components 3a and 3b arranged to be spaced from each other, the contact area (heat transfer area) between heat conduction plate 13 and heat transfer sheet 15 is increased. Since the heat is spread over the surface of heat conduction plate 13, a heat transfer area A for the bulk thermal resistance (Rb) in equation (2) described above is increased. Thereby, thermal resistance Rb of each of heat conduction plate 13 and heat transfer sheet 15 can be decreased. As a result, the heat generated in electronic components 3a, 3b, and the like can be dissipated further efficiently.

It should be noted that, although two electronic components 3a and 3b have been described as an example of the plurality of electronic components in semiconductor device 1 described above, three or more electronic components may be arranged on wiring board 5 and heat conduction plate 13 may be arranged to extend over the three or more electronic components.

Third Embodiment

As a semiconductor device in accordance with a third embodiment, an example of a semiconductor device having a heat conduction plate covering side surfaces and an upper surface of an electronic component will be described.

Figure 14:
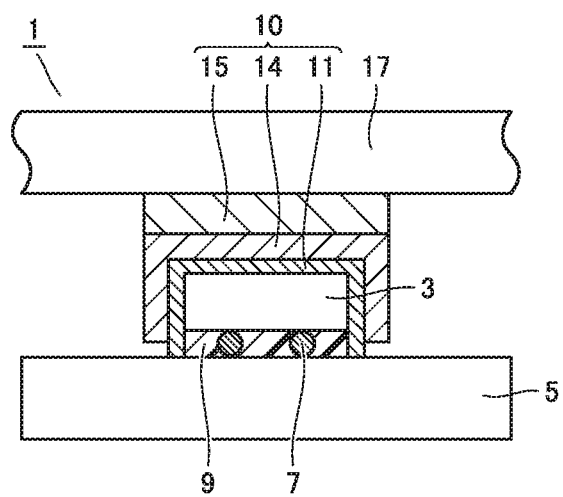
FIG. 14 is a cross sectional view of a semiconductor device in accordance with a third embodiment.

As shown in FIG. 14, in semiconductor device 1, electronic component 3 is mounted on wiring board 5. Electromagnetic wave absorption sheet 11 is arranged to contact an upper surface and side surfaces of electronic component 3. A heat conduction plate 14 is arranged to contact a portion of electromagnetic wave absorption sheet 11 covering the side surfaces and the upper surface of electronic component 3. Heat transfer sheet 15 is arranged to contact heat conduction plate 14.

Figure 15:
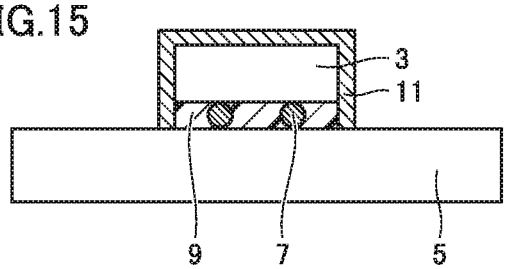
FIG. 15 is a cross sectional view showing one step of a method for manufacturing the semiconductor device shown in FIG. 14 in the same embodiment.

Next, an example of a method for manufacturing semiconductor device 1 described above will be described. The manufacturing method is basically the same as that in the first embodiment. First, as shown in FIG. 15, electronic component 3 is mounted on the surface of wiring board 5 through the same step as the step shown in FIG. 7. Electromagnetic wave absorption sheet 11 is arranged to contact the upper surface and the side surfaces of the electronic component.

Figure 16:
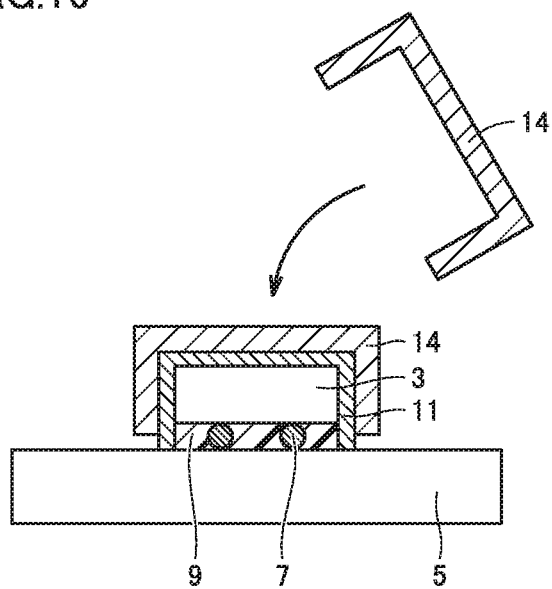
FIG. 16 is a cross sectional view showing a step performed after the step shown in FIG. 15 in the same embodiment.

Then, as shown in FIG. 16, heat conduction plate 14 having a portion covering each of the side surfaces and the upper surface of electronic component 3 is prepared. Heat conduction plate 14 is arranged to contact the portion of electromagnetic wave absorption sheet 11 covering the side surfaces and the upper surface of electronic component 3.

Figure 17:
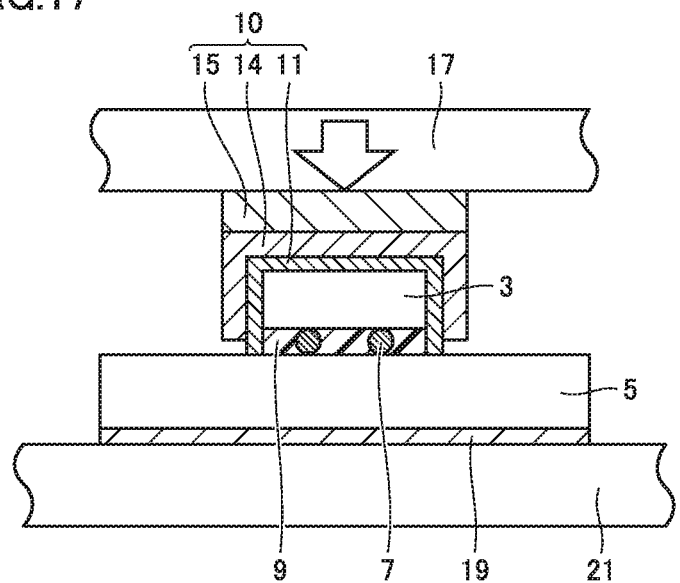
FIG. 17 is a cross sectional view showing a step performed after the step shown in FIG. 16 in the same embodiment.

Then, as shown in FIG. 17, heat transfer sheet 15 is pressed by heat dissipation member 17 (see the arrow), with electronic component 3 and the like being sandwiched between heat dissipation member 17 and supporting member 21, through the same steps as the steps shown in FIGS. 10 and 11. On this occasion, heat transfer sheet 15 is pressed until its thickness is reduced to about 0.7 mm. In this way, the main portion of semiconductor device 1 is completed.

In semiconductor device 1 described above, heat generated from electronic component 3 and heat generated from electromagnetic wave absorption sheet 11 can be efficiently dissipated through heat conduction member 10 including heat conduction plate 14 and heat transfer sheet 15, as in semiconductor device 1 described in the first embodiment.

Further, in semiconductor device 1 described above, heat conduction plate 14 includes not only a portion which contacts a portion of electromagnetic wave absorption sheet 11 covering the upper surface of electronic component 3, but also portions which contact portions of electromagnetic wave absorption sheet 11 covering the opposite side surfaces of electronic component 3. Thereby, electromagnetic wave absorption sheet 11 covering electronic component 3 is held down by heat conduction plate 14. As a result, misalignment of electromagnetic wave absorption sheet 11 with respect to electronic component 3 is suppressed, and productivity of semiconductor device 1 can be improved.

Fourth Embodiment

As a semiconductor device in accordance with a fourth embodiment, an example of a semiconductor device to which a heat transfer sheet containing metal particles is applied will be described.

Figure 18:
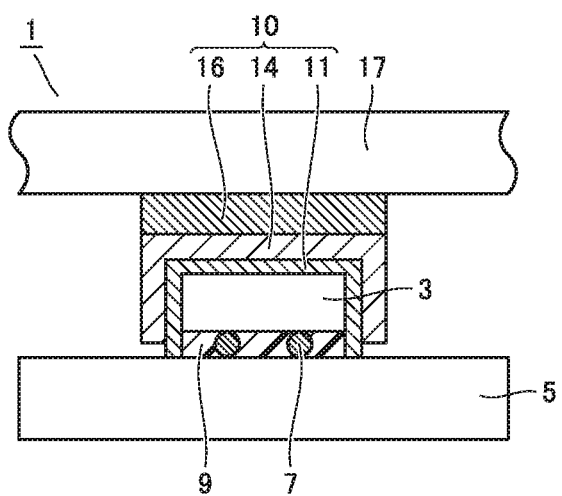
FIG. 18 is a cross sectional view of a semiconductor device in accordance with a fourth embodiment.

As shown in FIG. 18, in semiconductor device 1, electromagnetic wave absorption sheet 11 is arranged to contact an upper surface and side surfaces of electronic component 3 mounted on wiring board 5. Heat conduction plate 14 is arranged to contact a portion of electromagnetic wave absorption sheet 11 covering the side surfaces and the upper surface of electronic component 3. A heat transfer sheet 16 is arranged to contact heat conduction plate 14. Heat transfer sheet 16 contains particles of a metal such as copper or aluminum, as heat conductive particles.

Heat dissipation member 17 is arranged to contact heat transfer sheet 16. It should be noted that, also in this semiconductor device 1, wiring board 5 is joined to a supporting member (not shown), as in the semiconductor device shown in FIG. 1. Further, heat transfer sheet 16 and electromagnetic wave absorption sheet 11 are pressed via heat dissipation member 17 toward electronic component 3. It should be noted that members identical to those of semiconductor device 1 shown in FIG. 1 or FIG. 14 will be designated by the same reference numerals, and the description thereof will not be repeated, except when necessary.

A method for manufacturing semiconductor device 1 described above is substantially the same as the method for manufacturing semiconductor device 1 described in the third embodiment, except that heat transfer sheet 16 contains metal particles.

In semiconductor device 1 described above, heat generated from electronic component 3 and heat generated from electromagnetic wave absorption sheet 11 can be efficiently dissipated through heat conduction member 10 including heat conduction plate 14 and heat transfer sheet 16, as in semiconductor device 1 described in the first embodiment and the like.

Further, in semiconductor device 1 described above, since heat transfer sheet 16 containing metal particles is applied as heat transfer sheet 16, heat transfer sheet 16 has electrical conductivity. In addition, heat dissipation member 17 is formed of a metal. Thus, by setting heat dissipation member 17 at a ground potential, heat conduction plate 14 is fixed to the ground potential via heat transfer sheet 16 having electrical conductivity, and heat conduction plate 14 has an electromagnetic shielding effect.

Heat conduction plate 14 is arranged to cover the upper surface and both side surfaces of the electronic component. Thereby, heat conduction plate 14 can shield a component of electromagnetic waves not absorbed by electromagnetic wave absorption sheet 11, of electromagnetic waves generated from electronic component 3. Heat conduction plate 14 can also shield electromagnetic waves generated from another electronic component (not shown). As a result, the effect of shielding electromagnetic waves can be further improved.

Fifth Embodiment

Figure 19:
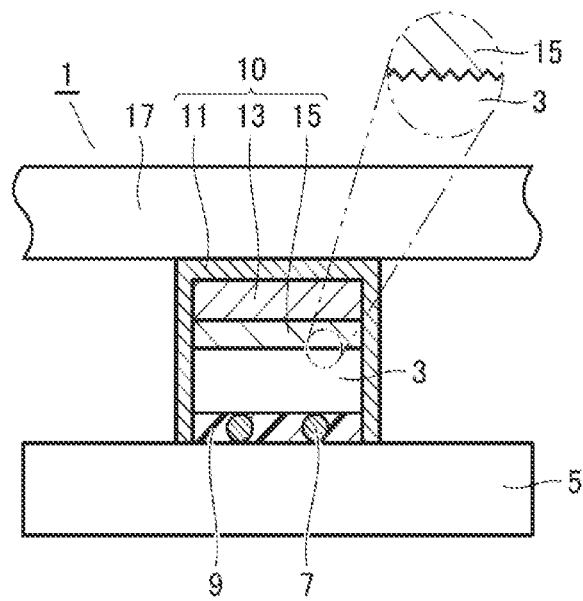
FIG. 19 is a cross sectional view of a semiconductor device in accordance with a fifth embodiment.

A semiconductor device in accordance with a fifth embodiment will be described. As shown in FIG. 19, in semiconductor device 1, heat transfer sheet 15 is arranged to contact an upper surface of electronic component 3 mounted on wiring board 5. Heat conduction plate 13 is arranged to contact heat transfer sheet 15. Electromagnetic wave absorption sheet 11 is arranged to cover electronic component 3, heat conduction plate 13, and the like, in a manner contacting heat conduction plate 13 and contacting side surfaces of electronic component 3. Heat dissipation member 17 is arranged to contact electromagnetic wave absorption sheet 11.

Further, also in this semiconductor device 1, wiring board 5 is joined to a supporting member (not shown), as in the semiconductor device shown in FIG. 1. Further, heat transfer sheet 15 and electromagnetic wave absorption sheet 11 are pressed via heat dissipation member 17 toward electronic component 3. It should be noted that members identical to those of semiconductor device 1 shown in FIG. 1 will be designated by the same reference numerals, and the description thereof will not be repeated, except when necessary.

Figure 20:
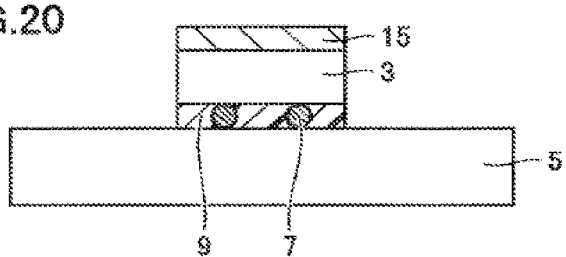
FIG. 20 is a cross sectional view showing one step of a method for manufacturing the semiconductor device shown in FIG. 19 in the same embodiment.
Figure 21:
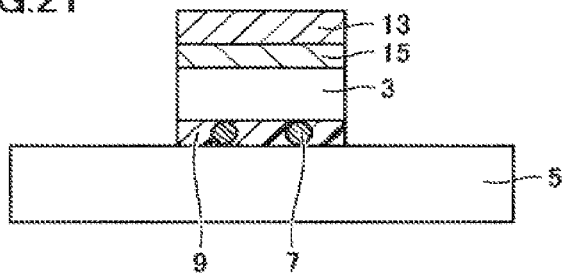
FIG. 21 is a cross sectional view showing a step performed after the step shown in FIG. 20 in the same embodiment.

Next, an example of a method for manufacturing semiconductor device 1 described above will be described. First, as shown in FIG. 20, electronic component 3 is mounted on the surface of wiring board 5 through the same step as the step shown in FIG. 7. Then, heat transfer sheet 15 is arranged to contact the upper surface of electronic component 3. Then, as shown in FIG. 21, heat conduction plate 13 is arranged to contact heat transfer sheet 15. Then, as shown in FIG. 22, electromagnetic wave absorption sheet 11 is arranged to cover electronic component 3, heat conduction plate 13, and the like, in a manner contacting the side surfaces of electronic component 3, heat conduction plate 13, and the like.

Then, as shown in FIG. 23, heat transfer sheet 15 and the like are pressed by heat dissipation member 17, with electronic component 3 and the like being sandwiched between heat dissipation member 17 and supporting member 21, through the same steps as the steps shown in FIGS. 10 and 11. On this occasion, heat transfer sheet 15 and the like are pressed until the thickness of heat transfer sheet 15 is reduced to about 70% of its original thickness. In this way, the main portion of semiconductor device 1 is completed.

In semiconductor device 1 described above, heat generated from electronic component 3 and heat generated from electromagnetic wave absorption sheet 11 can be efficiently dissipated through heat conduction member 10 including heat conduction plate 13 and heat transfer sheet 15, as in semiconductor device 1 described in the first embodiment.

Further, in the semiconductor device described above, heat transfer sheet 15 having a heat conduction better than that of electromagnetic wave absorption sheet 11 is arranged to contact the upper surface of electronic component 3. Thereby, heat locally generated in the upper surface of electronic component 3 can be spread over a surface of heat transfer sheet 15, and the heat transfer area is further increased. As a result, the bulk thermal resistance (Rb) in equation (1) described in the first embodiment can be decreased, and heat dissipation performance can be further improved.

In addition, in electronic component 3, it is desirable to set the surface roughness (Ry) of the upper surface of electronic component 3 contacted by heat transfer sheet 15 to less than or equal to 5 µm. Thereby, as described in the first embodiment, the contact thermal resistance (Rc) in equation (1) can be further decreased, and heat dissipation performance can be improved.

It should be noted that the arrangement structure of heat conduction member 10 described above is also applicable to the electronic component in which the lead electrode protrudes from the side surface of the electronic component (body) shown in FIG. 12.

Sixth Embodiment

As a semiconductor device in accordance with a sixth embodiment, an example of a semiconductor device to which a heat transfer sheet is applied to contact side surfaces and an upper surface of an electronic component and an upper surface of a wiring board will be described.

As shown in FIG. 24, in semiconductor device 1, electromagnetic wave absorption sheet 11 is arranged to contact an upper surface and side surfaces of electronic component 3 mounted on wiring board 5. Heat conduction plate 14 is arranged to contact a portion of electromagnetic wave absorption sheet 11 covering the upper surface and the side surfaces of electronic component 3. Heat transfer sheet 15 is arranged to contact heat conduction plate 14 and wiring board 5. Heat dissipation member 17 is arranged to contact heat transfer sheet 15.

It should be noted that, also in this semiconductor device 1, wiring board 5 is joined to a supporting member (not shown), as in the semiconductor device shown in FIG. 1. Further, heat transfer sheet 15 and electromagnetic wave absorption sheet 11 are pressed via heat dissipation member 17 toward electronic component 3. Members identical to those of semiconductor device 1 shown in FIG. 1 or FIG. 14 will be designated by the same reference numerals, and the description thereof will not be repeated, except when necessary.

A method for manufacturing semiconductor device 1 described above is substantially the same as the method for manufacturing semiconductor device 1 described in the third embodiment, except that heat transfer sheet 15 is arranged to contact wiring board 5.

Semiconductor device 1 described above has electromagnetic shielding performance, as with semiconductor device 1 described in the first embodiment. Further, in semiconductor device 1 described above, heat generated from electronic component 3, heat generated from electromagnetic wave absorption sheet 11, and heat generated from wiring board 5 can be efficiently dissipated through heat conduction member 10 including heat conduction plate 14 and heat transfer sheet 15, and wiring board 5. Furthermore, heat from the outside derived from sunlight or outdoor air temperature can also be efficiently dissipated.

Further, in semiconductor device 1 described above, heat transfer sheet 15 includes portions which contact the portions of side surfaces of heat conduction plate 14 and an upper surface of wiring board 5. Thereby, heat transfer sheet 15 is held down by heat dissipation member 17 and wiring board 5. Accordingly, in a case where a force is exerted on electronic component 3 in a shear direction, for example, during manufacturing of semiconductor device 1, heat transfer sheet 15 functions as a reinforcing member, and can suppress misalignment of electronic component 3. As a result, productivity of semiconductor device 1 can be improved.

The semiconductor devices described in the respective embodiments can be combined in various manners as necessary.

The embodiments disclosed herein are illustrative, and the present invention is not limited thereto. The scope of the present invention is defined by the scope of the claims, rather than the scope described above, and is intended to include any modifications within the scope and meaning equivalent to the scope of the claims.

INDUSTRIAL APPLICABILITY

The present invention is effectively utilized for a semiconductor device in which an electronic component is covered with an electromagnetic wave absorption sheet. In particular, the present invention is effectively utilized for a transmission unit of a wireless communication apparatus, including a transmission unit of a portable base station, a high power transmitter, a portable telephone, or the like.

REFERENCE SIGNS LIST

1: semiconductor device; 3, 4: electronic component; 5: wiring board; 6: lead electrode; 7: solder joint portion; 8: solder joint portion; 9: thermosetting resin; 10: heat conduction member; 11: electromagnetic wave absorption sheet; 13, 14: heat conduction plate; 15, 16: heat transfer sheet; 17: heat dissipation member; 19: bonding layer; 21: supporting member; 31: screw; 33: spacer; 41: heat conductive particles; 43: silicone gel.

The invention claimed is:

1. A semiconductor device comprising:
a wiring board;
an electronic component mounted on the wiring board;

a heat dissipation member arranged to be spaced from the electronic component; and a heat conduction member interposed between the heat dissipation member and the electronic component, and conducting heat generated in the electronic component to the heat dissipation member, the heat conduction member including
an electromagnetic wave absorption sheet,
a heat transfer sheet in which heat conductive particles are added to a resin, and
a heat conduction plate having a flat surface portion, interposed and in direct contact with the electromagnetic wave absorption sheet and the heat transfer sheet, the heat conductive particles contacting the flat surface portion of the heat conduction plate, the electromagnetic wave absorption sheet being arranged to cover the electronic component and to directly contact at least a side portion of the electronic component.

2. The semiconductor device according to claim 1, wherein
the heat conduction plate is larger than an area of the electronic component when the electronic component is viewed in plan view from above in a state where the electronic component is mounted on the wiring board, and
a surface roughness of the flat surface portion of the heat conduction plate contacting the heat transfer sheet and a surface roughness of a contact surface of the heat dissipation member contacting the heat transfer sheet are less than or equal to 5 µm.

3. The semiconductor device according to claim 1, wherein the electromagnetic wave absorption sheet is arranged to contact an upper portion of the electronic component.

4. The semiconductor device according to claim 3, wherein the heat conduction plate is arranged to contact a portion of the electromagnetic wave absorption sheet covering the upper portion of the electronic component.

5. The semiconductor device according to claim 3, wherein the heat conduction plate is arranged to contact a portion of the electromagnetic wave absorption sheet covering the upper portion of the electronic component, and a portion of the electromagnetic wave absorption sheet covering the side portion of the electronic component.

6. The semiconductor device according to claim 3, wherein the heat transfer sheet is arranged to contact the wiring board, an upper portion of the heat conduction plate and a side portion of the heat conduction plate, and the heat dissipation member.

7. The semiconductor device according to claim 1, wherein the heat transfer sheet contains metal particles.

8. The semiconductor device according to claim 1, wherein
the heat transfer sheet is arranged to contact an upper portion of the electronic component,
the heat conduction plate is arranged to contact the heat transfer sheet, and
the electromagnetic wave absorption sheet is arranged to contact the heat conduction plate.

9. The semiconductor device according to claim 8, wherein a surface roughness of a contact surface in the upper portion of the electronic component contacted by the heat transfer sheet is less than or equal to 5 µm.

10. A wireless communication apparatus comprising the semiconductor device according to claim 1.

11. The semiconductor device according to claim 1, wherein the heat conduction plate is a copper plate having a thickness of more than or equal to 0.2 mm.

12. A method for manufacturing a semiconductor device, comprising:
mounting an electronic component on a wiring board;
arranging a heat conduction member to contact the electronic component; and
arranging a heat dissipation member to contact the heat conduction member,
arranging the heat conduction member including
arranging an electromagnetic wave absorption sheet,
arranging a heat transfer sheet in which heat conductive particles are added to a resin, and
arranging a heat conduction plate having a flat surface portion,
in arranging the electromagnetic wave absorption sheet, the electromagnetic wave absorption sheet being arranged to cover the electronic component and to directly contact at least a side portion of the electronic component,
in arranging the heat conduction plate, the heat conduction plate being arranged between the electromagnetic wave absorption sheet and the heat transfer sheet to directly contact the electromagnetic wave absorption sheet and the heat transfer sheet,
in arranging the heat dissipation member, the heat conduction member being pressed by the heat dissipation member toward the electronic component.

13. A wireless communication apparatus comprising a semiconductor device manufactured by the method for manufacturing the semiconductor device according to claim 12.

\* \* \* \* \*